United States Patent [19]

Rathmell

[11] Patent Number: 4,816,693
[45] Date of Patent: Mar. 28, 1989

[54] APPARATUS AND METHOD FOR UNIFORM ION DOSE CONTROL

[75] Inventor: Robert D. Rathmell, Madison, Wis.

[73] Assignee: National Electrostatics Corp., Middleton, Wis.

[21] Appl. No.: 88,138

[22] Filed: Aug. 21, 1987

[51] Int. Cl.[4] ............................................. H01J 37/317
[52] U.S. Cl. .................................. 250/492.2; 250/398; 250/397
[58] Field of Search ............... 250/492.21, 397, 398, 250/492.2; 324/71.1, 71.3; 219/121 EW

[56] References Cited

U.S. PATENT DOCUMENTS

| | | | |
|---|---|---|---|
| 3,207,982 | 9/1965 | Rose | 324/71.1 |
| 3,689,766 | 9/1972 | Freeman | 250/49.5 T |
| 3,778,626 | 12/1973 | Robertson | 250/492.21 |
| 3,789,298 | 1/1974 | Herb | 324/71 EB |
| 4,011,449 | 3/1977 | Ko et al. | 250/309 |
| 4,021,675 | 5/1977 | Shifrin | 250/492 A |
| 4,234,797 | 11/1980 | Ryding | 250/492 B |
| 4,357,536 | 11/1982 | Varma et al. | 250/397 |
| 4,494,005 | 1/1985 | Shibata et al. | 250/492.2 |
| 4,517,465 | 5/1985 | Gault et al. | 250/492.2 |

OTHER PUBLICATIONS

J. H. Keller, C. M. McKenna, J. R. Winnard, W. W. Hicks, J. E. Hoffman, J. R. Kranik, and W. F. Mueller, *Development of a Prototype High-Current Low-Energy Ion Implanter*, 44 Radiation Effects, 195–200, (1979).
K. Matsuda, T. Kawai, M. Naitoh, and M. Aoki, *A High Current Ion Implanter Machine*, Nuclear Instruments and Methods in Physics Research B6, 35–38, (1985).
K. Steeples, *Dose Control With High Power Ion Beams on Photoresist Masked Targets*, Journal of Vacuum Science and Technology, vol. B2, No. 1, 58–62, (1984).
E. J. Sternglass, *Theory of Secondary Electron Emission by High-Speed Ions*, Physical Review vol. 108, No. 1, 1–9, (1957).
O. Almen and G. Bruce 11, Nucl. Inst. & Meth., 279, (1961).
B. Perovic and B. Cobie, *Cathode Sputtering of Cu and Ag by A+ Ions of Energies from 10–200 KeV*, Proc. Vth Intl. Conf. on Ionization Phenom. in Gasses, Munich, 1165–1171, (1962).
David T. Goldman and Albert Simon, *Theory of Sputtering by High-Speed Ions*, Physical Review, vol. 111, No. 2, 383–386, (1958).
P. K. Rol. J. M. Fluit, and J. Kistemaker, *Sputtering of Copper by Bombardment with Ions of 5–25 KeV*, 26 Physica 1004–1010, (1960).
G. I. Robertson, *Rotating Scan for Ion Implantation*, Western Electric Engineering, Princeton, N.J. 08540.
J. G. McCallum, G. I. Robertson, A. F. Rodde, B, Weissman, and N. Williams, Journal of Vacuum Science and Technology, vol. 15, No. 3, 1087–1089 (1978).
W. N. Hammer, *On-Line Ion Implantation Dose Uniformity Monitor*, IBM Technical Disclosure Bulletin, vol. 18, No. 7, (1975).

*Primary Examiner*—Bruce C. Anderson
*Assistant Examiner*—Jack I. Berman
*Attorney, Agent, or Firm*—Lathrop & Clark

[57] ABSTRACT

A uniform ion implantation dose control apparatus controls the implantation of ion particles onto at least one wafer mounted on a rotating disk in the pathway of the ion particle beam. A grounded scanning wire is repeatedly moved across the beam to produce an emission of secondary electrons which is linearly proportional to the beam particle current. The secondary electrons emitted are collected and formed into a current $I_s$ by a collector electrode. Portions of the current $I_s$ on the collector electrode are sampled. While the vacuum conditions within the beamline are good, the beams electrical current $I_{FC}$ is measured and the collector current $I_s$ sample is calibrated therewith so that when the beamline vacuum becomes a high pressure vacuum, additional collector current $I_s$ samples may be utilized to determine a theoretical beam current I which is a function of the beam particle current $I_p=I/q$. This theoretical beam current I is utilized to move the rotating disk along a radial pathway perpendicular to the beam pathway at a velocity V which is proportional to the theoretical beam current I.

26 Claims, 5 Drawing Sheets

APPARATUS AND METHOD FOR UNIFORM ION DOSE CONTROL

BACKGROUND OF THE INVENTION

1. Field of the Invention

This invention pertains generally to the field of treating wafers with particle beams, and particularly to controlling the dosage of and ensuring the uniform distribution of the beam particles on to the wafers.

2. Description of the Prior Art

Various types of apparatus and methods have been developed for achieving a uniform ion dose on semiconductor wafers which are having ions implanted thereon by an ion particle beam. Several of such devices are shown in U.S. Pat. Nos. 3,778,626 to Robertson, No. 4,234,697 to Ryding and No. 4,517,465 to Gault, et al., the disclosures of which are herein incorporated by reference. As disclosed in the patent to Robertson, a rotating disk can be used to support wafers for batch processed ion implantation. To achieve a uniform dosage, the rotating disk must be scanned laterally along a radial pathway perpendicular to the beam by the ion beam at a velocity $V=NI/2\#rqD$, where N is the number of single direction scans over the disk surface, I is the beam current where I/q is the beam particle current, r is the distance between the beam and the axis of rotation of the rotating disk, q is the expected charge per ion, and D is the final dose in ion particles per square area desired. The above-stated formula demonstrates that the linear translational velocity of the spinning disk must vary in proportion to the beam current I, and inversely with the distance between the ion beam and the axis of rotation of the disk.

This relationship has been put into practice in the past by various different methods and apparatuses. A variable pitch screw has been used to provide the 1/r dependence and in addition, current on the disk itself has been measured and the velocity of the motor causing linear translational movement of the spinning disk changed to compensate for variations in that measured current. The patent to Robertson discloses measuring the current on the rotating disk, and measuring the distance between the rotational axis of the disk and the beam, and then driving the linear drive motor in proportion to I/r with a constant pitch linear drive mechanism. Both of these methods require that the current I be measured on the disk. Several problems occur in measuring the current I on the disk, though. A large disk is susceptible to the pickup of electromagnetic interference, and can have noise generated in the rotating current contacts. In addition, since the disk surface is not a flat smooth surface, it is difficult to prevent the escape from the rotating disk of secondary ions which are generated as the ion beam strikes the surface of the disk. As a result of these problems, the beam current I which is measured by these techniques might not be accurately indicative of the beam particle current. It is the beam particle current $I_p=I/q$ which is critical to determining ion particle dosage on the wafers.

These problems have been overcome in the past by using a disk having a rectangular slot cut therethrough along the radius of the disk, and using a Faraday cup behind the spinning disk to monitor the ion beam. Placing the Faraday cup behind the slotted spinning disk is a more accurate method of beam current measurement than is measuring the current on the disk. In addition, since the rotational velocity of the spinning disk varies in proportion to 1/r for a disk spinning with a constant angular velocity, the charge collected in each current pulse in the Faraday cup varies according to I/r. This technique of gathering the current pulses in back of a slotted spinning disk with a Faraday cup was utilized in the patent to Ryding to control the linear translational velocity of the spinning disk. In the patent to Gault, et al., this technique was used to control a distance r between the ion beam and the axis of rotation of the disk, without the need for separately measuring the distance between the beam and the axis of rotation of the disk. With this method, the Faraday cup reading alone can be used to compensate for the variation in beam current I and distance r between the beam and the disk axis. Other techniques also were developed using a Faraday cup which would monitor the beam current I periodically by moving the rotating disk out of the way.

It has been found that another problem occurs with both the Faraday cup measurement techniques and with the disk current measuring techniques. Both methods may be susceptible to error due to charge exchange reactions between the ion beam and the molecules of the residual gas within the vacuum. In both methods, the implanted particle dose is calculated based on the beam electrical current and the expected charge state q of the beam. At low energies, the positively charged ion particles tend to pick up electrons to thereby become less positive or even neutral. At high energies the beam ion particles tend to strip to higher positive charge states. Under those conditions in which the residual gas pressure is relatively high, for example, when wafers coated with photoresist are implanted with ion beam particles, these charge exchange reactions often can lead to inaccurate doses. In such situations, the measured beam electrical current might not be a function of, or indicative of the beam particle current $I_p=I/q$. Although the vacuum within the beam line might be in a good condition when the beam begins scanning the wafers, the wafer scanning by the particle beam causes the wafers to give off gaseous molecules which eventually permeate the beam line, thereby increasing the residual gas throughout the beam line.

A technique of passing a grounded wire through an ion beam to cause secondary electrons to be ejected from the wire, and collecting those emitted secondary electrons to display the shape of the beam is disclosed in U.S. Pat. No. 3,789,298 to Herb, the disclosure of which is herein incorporated by reference. In Herb a collector electrode is spaced outwardly from the scanning wire to collect the secondary electrons emitted by the scanning wire into a current. This secondary electron current then is directed to an oscilloscope and used to display the shape of the ion particle beam. The secondary electron current on the collector electrode has also been monitored by a metering circuit to determine relative beam current. For example, the secondary electron current has been monitored to determine whether or not the ion beam was still there, or whether its intensity had increased or decreased in relative value.

A need exists for an apparatus and method for uniform ion implantation dose control in which the beam current I measured is the function of the beam particle current $I_p=I/q$, even when the residual gas pressure with the vacuum is relatively high.

SUMMARY OF THE INVENTION

The present invention is summarized in that a uniform ion implantation dose control apparatus is used in conjunction with a beam line for a high voltage accelerator or similar device to control the implantation of a uniform dose of ion particles onto at least one wafer mounted on a rotating disk in the pathway of the ion particle beam. The uniform ion implantation does control apparatus includes a scanning wire beam monitor which includes a rotor having a scanning wire which is movable across the beam to produce an emission of secondary electrons, the scanning wire being moved by rotation of the rotor; and a collector electrode spaced outwardly from a portion of the scanning wire which is emitting secondary electrons to receive these secondary electrons, the collector electrode defining two openings through which the beam can pass. Preferably, the scanning wire beam monitor further includes two suppressors which are biased negatively and which each is located adjacent to one of the collector electrode openings to inhibit the escape of secondary electrons through the openings. The uniform ion implantation dose control apparatus further includes a first current sensing circuit which is connected to the collector electrode to measure a collector current $I_s$ on the collector electrode due to secondary electron emission, and which transmits at least one collector current signal which collector current signals are collectively substantially a function of a beam particle current $I/q$ passing through the scanning wire beam monitor as well as the energy and mass of the incident particle; and a beam electrical current $I_{FC}$ sensing device which periodically senses the beam electrical current $I_{FC}$. Preferably, this beam electrical current sensing device is a Faraday cup which is periodically movable into the beam pathway to collect the beam electrical current $I_{FC}$ when the wafers are being loaded and unloaded from the disk and the vacuum is in a good condition. The apparatus furthermore includes a second current sensing circuit which is connected to the beam electrical current sensing device to measure the beam electrical current $I_{FC}$ sensed by the current sensing device due to the particle beam, and which transmits a sensing device current signal which is a function of the electrical current $I_{FC}$ in the ion beam; a disk translation system which moves the rotating disk along a radial pathway substantially perpendicular to the beam pathway; and a computer connected to receive both the collector current signals and the sensing device current signal, which calibrates said collector current signals to the sensing device current signal when said signals are both transmitted when the beam electrical current sensing device is sensing the beam electrical current, which when the ion beam particles are directed at the disk calculates a beam current $I$ from said collector current signals, and which is connected to transmit a control signal to the disk translation system to control said system which moves the rotating disk along said perpendicular radial pathway at a velocity $V = NI/2\#rqD$ where: N is the desired number of single scans to be made by the beam over the disk; r is the distance between a beam and the axis of rotation of the disk; q is the expected charge per ion; and D is the desired ion dose to be applies to the wafers.

The uniform ion implantation dose control method is utilized to implant, with an ion beam, a uniform dose of ion particles onto at least one wafer mounted on the surface of a rotating disk. The method includes the steps of moving a grounded object across a pathway of the ion beam to produce an emission of secondary electrons from the object, collecting the secondary electrons to form a collector current $I_s$, sampling the collector current $I_s$ to obtain collector current samples which are substantially a function of the beam particle current $I_p = I/q$, periodically measuring a beam electrical current $I_{FC}$, periodically calibrating a collector current sample to the beam electrical current $I_{FC}$, thereafter computing a beam current $I$ from at least one collector current sample until the beam electrical current $I_{FC}$ is measured again, determining a distance r between the beam and the axis of rotation of the disk, and moving the disk along a radial path substantially perpendicular to the beam pathway at a velocity $V = NI/2\#rqD$ where: N is the desired number of single scans to be made by the beam, q is the expected charge per ion, and D is the desired ion dose to be applied to the wafers.

A primary object of the invention is to provide an apparatus and method for monitoring an ion beam current $I$ which is indicative of and a function of the beam particle current $I_p = I/q$, even though the vacuum within the beam line is a high pressure vacuum.

Another object of the present invention is to provide an apparatus and method of uniform ion implantation dose control which accurately controls the implantation of a uniform dose of ion particles onto at least one wafer mounted on a rotating disk in the pathway of the ion particle beam, despite the charge exchange reactions between the ion beam and the molecules of residual gas within the high pressure vacuum of the beam line.

An additional object of the present invention is to provide an apparatus and method which ensure that the rotating disk with mounted wafers moves along a radial pathway substantially perpendicular to the beam pathway at a velocity which is proportional to the beam particle current $I_p$, and which is inversely proportional to the distance between the beam and the axis of rotation of the rotating disk, despite the beam ion particles losing or gaining electrons as the beam moves through a residual gas within the beam line vacuum.

Other objects, features, and advantages of the invention will be apparent from the following detailed drawings wherein a preferred embodiment of the invention has been selected for exemplification.

BRIEF DESCRIPTION OF THE DRAWINGS

FIG. 5 shows cyclical graphs of the trigger mechanism signals and collector current $I_s$ of the first preferred scanning wire beam monitor.

DESCRIPTION OF THE PREFERRED EMBODIMENT

Figure 1:
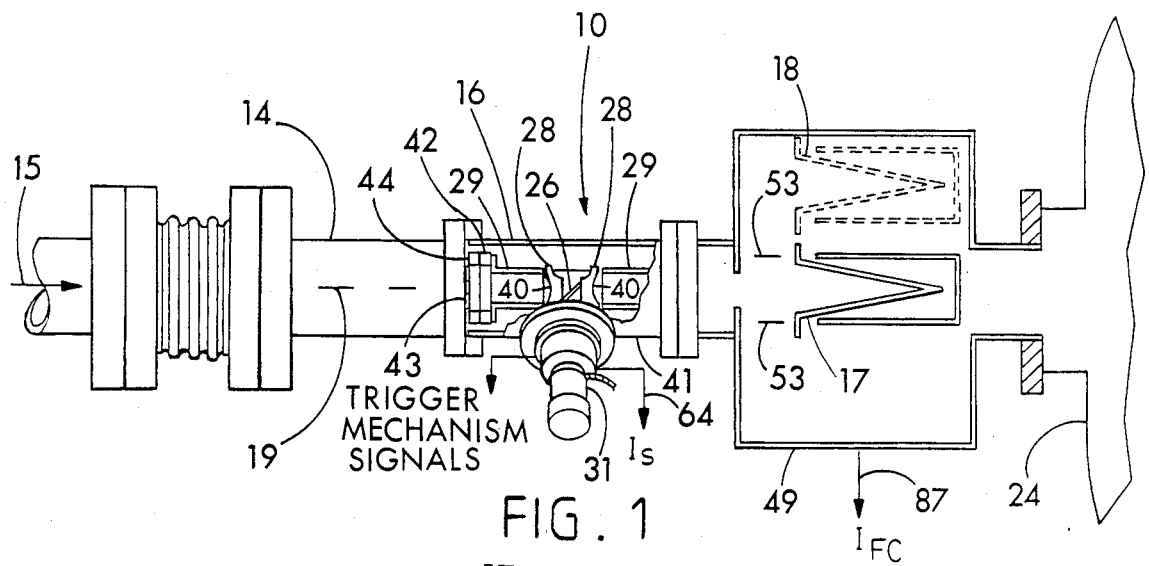
FIG. 1 is a diagrammatic, plan view of a preferred embodiment of the uniform ion implantation dose control apparatus, excluding the control electronics.
Figure 2:
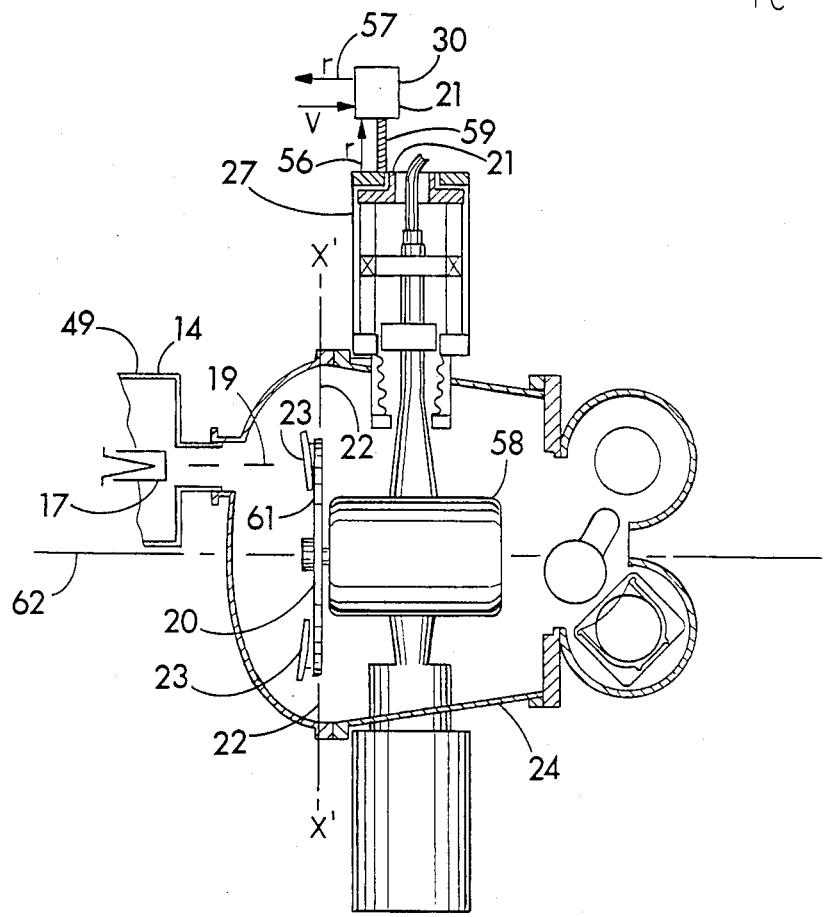
FIG. 2 is a diagrammatic, top plan section view of the wafer handling end station and connected disk translation system.
Figure 6:
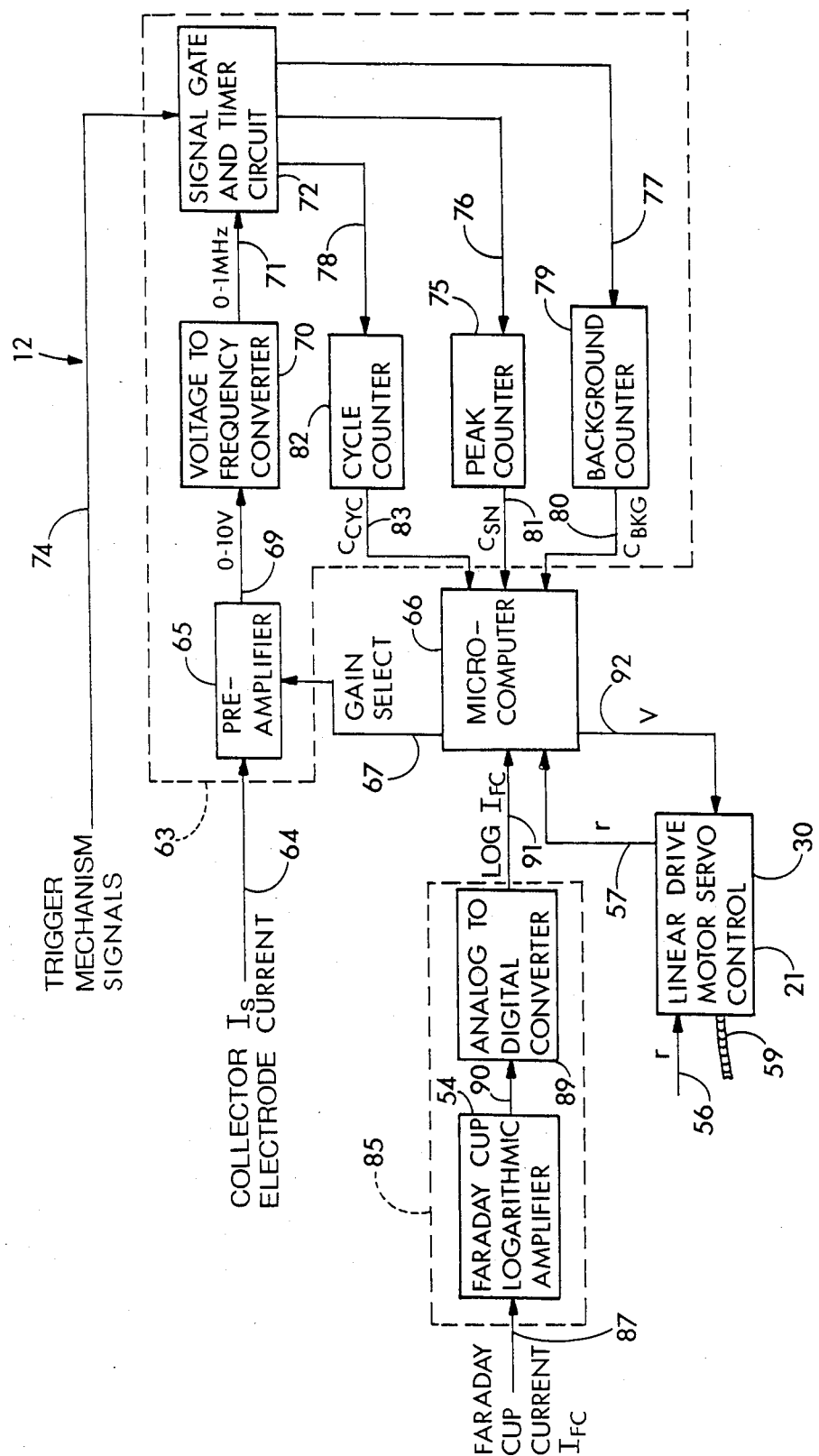
FIG. 6 is a schematic diagram showing the control electronics of the preferred uniform ion implantation dose control apparatus.

Referring more particularly to the drawings, wherein like numbers refer to like parts, FIGS. 1 and 2 show schematically and pictorially an apparatus for uniform ion implantation dose control 10. FIG. 6 shows the control electronics 12 for the apparatus 10. The ion implantation dose control apparatus 10 is used in connection with a beam tube or beam line 14 for a high voltage accelerator or other similar device which is adapted to produce a beam 15 of high energy particles, which may be electrons, protons, deuterons, or negative ions, for example. These beam particles are painted onto wafers 23 which are mounted on a rotating disk 20.

The preferred apparatus 10 includes a scanning wire beam monitor 16, a Faraday cup 17 and 18 which periodically moves into the beam pathway 19 to measure the beam electrical current $I_{FC}$, and a disk translation system 21 which are diagrammatically shown in FIGS. 1 and 2, and the control electronics 12 shown schematically in FIG. 6. The apparatus 10 controls the linear translational movement of the rotating disk 20 along the axis X' in FIG. 2 to ensure that a uniform controlled dose of ions are painted onto the wafers 23. The axis X' indicates a radial pathway 22 perpendicular to the beam 15 along which the disk 20 moves to ensure a proper uniform painting of the wafers 23 by ion particles.

The disk 20 is mounted on a wafer handling end station 24 which loads and unloads the wafers 23 on the disk 20, rotates the disk 20, and moves the disk 20 back and forth along the radial pathway 22. The end station 24 includes the linear translation mechanism 27 which actually moves the disk 20 along the pathway 22. Part of the electronics system 12 is the linear drive motor servo control 30 shown in FIGS. 2 and 6. The linear translation mechanism 27 and linear drive motor servo control together comprise the disk translation system 21.

Alternatively, in the place of the linear translation mechanism 27, other types of mechanical scanning systems could be used to move the wafers across the ion beam to ensure uniform ion particle implantation. For example, the patent to Ryding discloses a belt-type mechanical scanning system.

To properly control the dosage of ion particles applied to the wafers 23, the beam particle current $I_p = I/q$ must be determined. The expected charge per ion q is generally known for the particular beam. When the beam line 14 is maintained at good (low pressure) vacuum conditions, beam particle measurement may be accomplished with accuracy by using a Faraday cup 17 to measure the beam electrical current $I_{FC}$. The beam particle current $I_p = I_{FC}/q$, where q is the expected charge per ion, and $I_{FC}$ is the measured beam electrical current.

A problem sometimes occurs in that when the wafers 23 are painted by the ion particles, gaseous molecules are given off by the wafers. This "residual" gas permeates the beamline 14, causing some of the beam ion particles to either lose or gain electrons. Thus, in this poor (high pressure) vacuum, the Faraday cup 17 current $I_{FC}$ readings are no longer accurately indicative of the beam particle current $I_p$, because the actual charge per ion is unknown and varies from the expected charge per ion q. In addition, the ion beam causes the residual gas to become ionized.

When a grounded wire which is formed from a material such as titanium or tantalum crosses the beam 15, the wire emits secondary electrons. We have found that the number of secondary electrons emitted from the wire bears a linear relationship to the beam particle current $I_p$. If these secondary electrons are collected and formed into a current which is then measured or sampled, this current can be compared to the Faraday cup current $I_{FC}$ while the vacuum is in good (low pressure) condition. Thus, the second electron emission can be calibrated to the Faraday cup current $I_{FC}$. Then when the condition of the beamline 14 vacuum is poor (high pressure), the secondary electron emission could be used to determine a theoretical beam current I, where beam particle current $I_p = I/q$, q being the expected charge per ion. This beam current I is a theoretical current which represents what the beam electrical current would be, but for the poor vacuum conditions. The expected charge per ion q also represents what the actual charge per ion would be, but for the poor vacuum. Thus, the scanning wire beam monitor 16 which has a wire 26 which crosses the beam 15 can be utilized in controlling and maintaining a uniform ion dose on the wafers 23.

Figure 3:
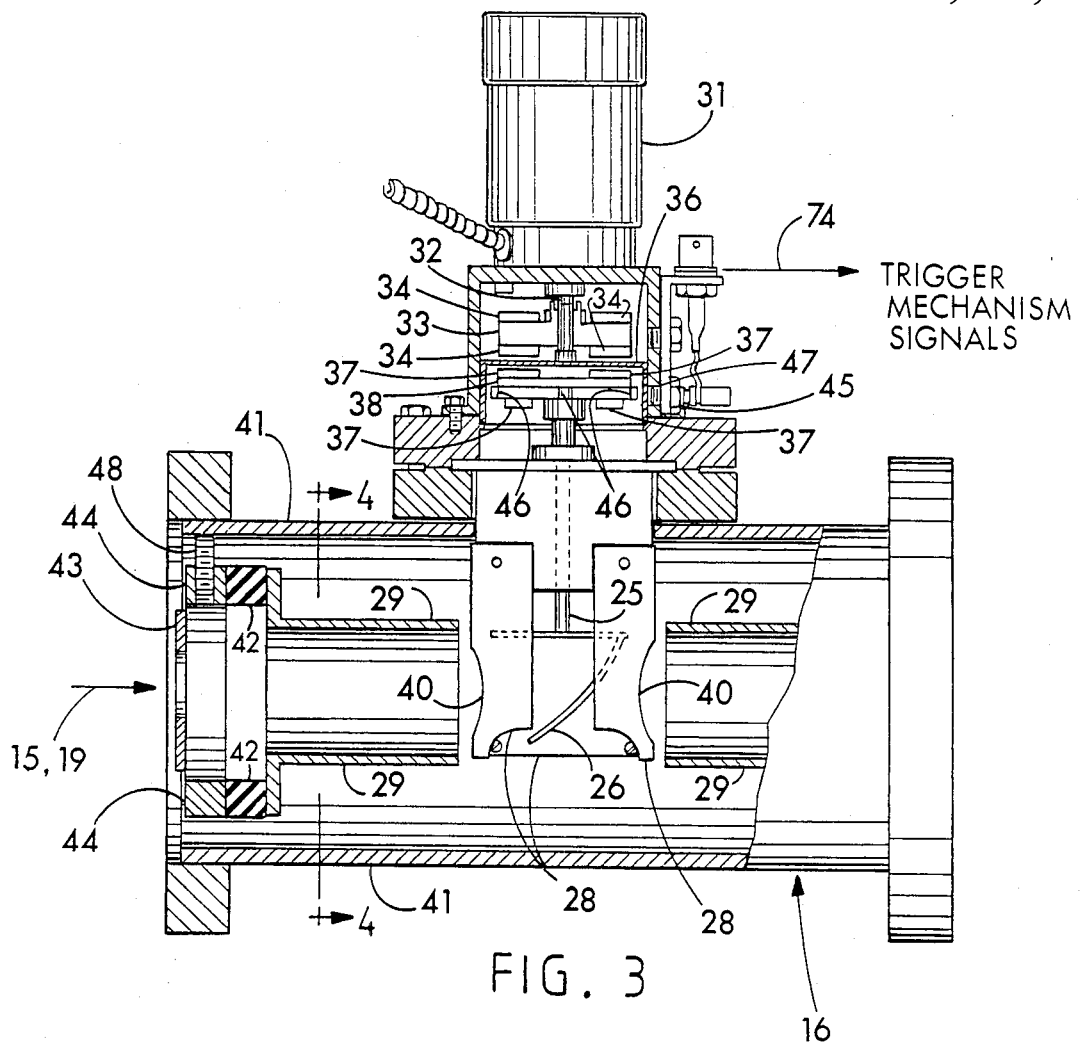
FIG. 3 is a partial longitudinal section view of the first preferred scanning wire beam monitor.
Figure 4:
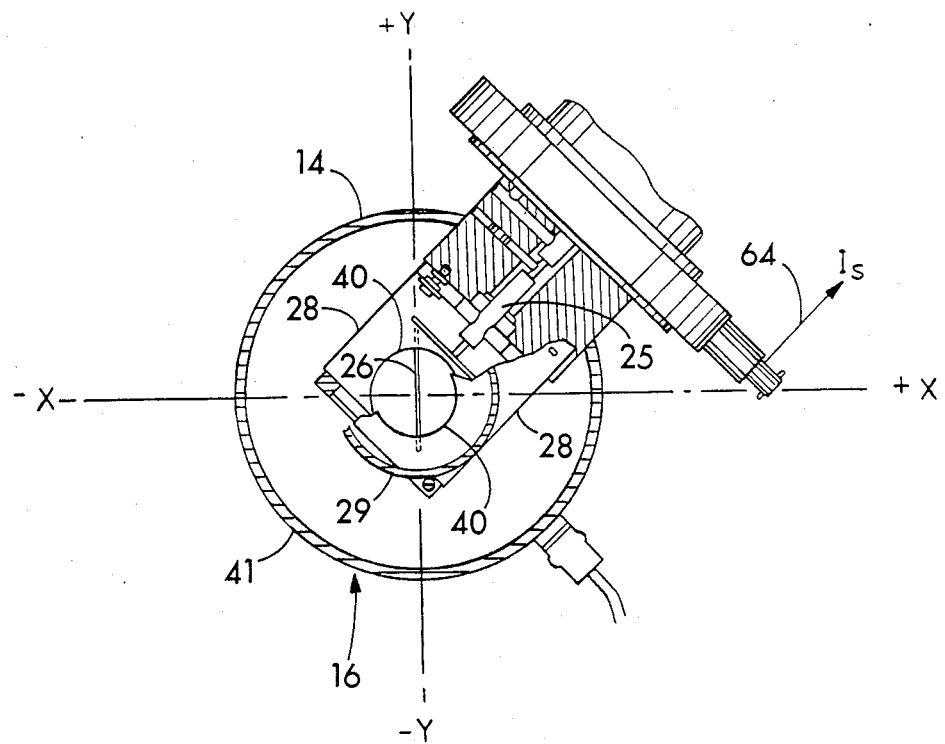
FIG. 4 is a partial cross-sectional view of the scanning wire beam monitor taken along section line 4—4 of FIG. 3.

As shown in FIGS. 3 and 4, the first preferred scanning wire beam monitor 16 includes a rotor 25 with a helical grounded scanning wire 26, a collector electrode 28 which is spaced outwardly from the scanning wire 26, and two suppressors 29 which are preferably negatively electrically biased with a −67 volt charge. The scanning wire 26 preferably is made from titanium or tantalum. These metals have low sputtering rates. Too much sputtering could cause contamination of the wafers 23. The scanning wire 26 intercepts less than 2% of the ion beam 15. Therefore, any contamination caused will be no greater than that caused by apertures in the beamline 14.

As the motor 31 operates, the upper shaft 32 rotates causing the upper member 33 and its attached magnets 34 to rotate. Below the wall 36 the vacuum exists in the monitor 16. The rotational force of the motor 31 is transmitted through the wall 36 by the magnets 34 to the lower magnets 37 which cause the lower member 38 and the rotor 25 to rotate. The beam monitor is similar to the beam scanner disclosed in U.S. Pat. No. 3,789,298 to Herb. The collector electrode 28 has openings 40 which allow the beam 15 to pass therethrough. As the rotor 25 rotates, the helical scanning wire 26 crosses the beam pathway 19 twice, once in an X direction, and once in a Y direction. As the beam 15 particles impinge upon the scanning wire 26, the scanning wire 26 emits secondary electrons which are collected by the collector electrode 28 to form a collector current $I_s$. The two annular suppressors 29 are each located adjacent to one of the openings 40 and are negatively biased to inhibit the secondary electrons from escaping the collector electrode 28 through the openings 40. Each suppressor 29 is mounted to the scanner housing through insulators such as those at 42 so that the suppressors are electrically insulated from the monitor housing 41. As shown in FIG. 3, the left-most suppressor 29 and aperture plate 43 are both mounted to an annular ring 44 which in turn is mounted to the monitor housing 41 by three set screws, one of which is shown at 48.

Preferably the scanning wire beam monitor 16 includes a trigger mechanism 45 which transmits trigger mechanism signals as the rotor rotates. In the monitor 16 shown in FIG. 3, attached to the lower member 38 are three permanent magnets 46 which are adapted to generate pulses in a pickup coil 47. One of the permanent magnets 46 produces an X trigger signal as the scanning wire crosses the beam in an X direction. Another magnet 46 produces a Y trigger signal as the scanning wire crosses the beam in a Y direction, and yet another of the magnets 46 produces an initializing trigger signal or background signal which is approximately 90° out of phase with both the X and Y trigger signals. The X trigger signal 51, Y trigger signal 52, and background signal 50 are shown graphically in FIG. 5.

Connected to the monitor 16 is the Faraday cup mechanism 49. The Faraday cup mechanism 49 shown schematically in both FIGS. 1 and 7 preferably is a high power standard Faraday cup mechanism such as the model FC18 Faraday cup manufactured by National Electrostatics Corporation. The Faraday cup 17 or 18 itself preferably is of the tantalum cone design. The steep cone shape spreads the beam power over the sides of the cone which decreases the effective power density on the tantalum surface, thereby eliminating local hot spots. Preferably the cone is indirectly water cooled to allow a conservative beam power rating of 1,000 watts for continuous beam with a minimum diameter of 3 millimeters. An indirect cooling design allows the use of ordinary tap water without current leakage. To the front of the Faraday cup 17 when the cup 17 is located in the beam pathway 19 is a suppressor 53 which helps to inhibit electrons from escaping from the cup 17. The deep tantalum cone design combined with the electron suppression should provide accurate beam current measurements. The suppressor 53 and the cup 17 can be separately biased to a maximum of 500 volts. The position of the Faraday cup 17 or 18 is controlled by a pneumatic cylinder (not shown) which is preferably actuated by 60 PSIG. air pressure. The motion is transmitted through a bellows seal (not shown) to move the Faraday cup to one side of the beam path 19 as shown in dashed lines at 18. The maximum beam clearance is 1 inch (2.54 centimeters). As shown in FIG. 6, a logarithmic amplifier 54 is used to read the Faraday cup 17. The Faraday cup is shown positioned in the beam pathway 19 schematically at 17. As indicated above, the Faraday cup readings are most accurate under good (low pressure) vacuum conditions. Since vacuum conditions are poor when the wafers 23 are being painted, the Faraday cup is positioned in the beam pathway 19 as shown at 17 only when wafers 23 are being loaded or unloaded from the disk 20. It is at that time when vacuum conditions are best, and Faraday cup readings are most indicative of the beam particle current $I_p$. Alternatively, another type of Faraday cup mechanism or beam electrical current sensing device could be used to collect or sense the beam electrical current $I_{FC}$.

As shown in FIG. 2, the wafers 23 are mounted on a rotating disk 20 within the wafer handling end station 24. The motor 58 rotates the disk 20 so that all of the wafers 23 are painted by the beam 15. The disk translation system 21 moves the disk 20 back and forth along the X' axis shown so that the entire surface of each wafer 23 is painted by the ion bean 15. The disk translation system 21 moves the disk 20 along the X' axis on a radial pathway 22 substantially perpendicular to the beam 15 so that the disk 20 is scanned laterally at a velocity:

$$V = NI/2\pi rqD$$

where:
N is the number of single scans over the disk surface 61,
is the theoretical beam current when the beam particle current $I_p = I/q$,
r is the distance between the ion beam 15 and the axis of rotation 62 of the disk 20,
q is the expected charge per ion, and
D is the desired ion dose in ions per square surface area to be applied to the wafers 23.

The linear translation mechanism 27 on the wafer handling end station 24 shown in FIG. 2 is the actual instrument which moves the disk 20 linearly back and forth. The linear translation mechanism 27 has an encoder (not shown) which transmits a signal which is a function of the distance r between the ion beam 15 and the axis of rotation 62 of the disk 20. This first r signal is transmitted through the lead 56 to the linear drive motor servo control 30, which is part of the control electronics 12. The servo control 30 in turn transmits a second r signal which is a function of the same distance to the microcomputer 66 through the lead 57. Once the control electronics 12 determines the appropriate velocity V for the disk 20, the servo control 30 delivers and regulates the DC power through the cable 59 to the linear translation mechanism 27 to cause it to move the disk 20 back and forth along the X' axis at the velocity V.

Alternatively, if another type of mechanical scanning system is used instead of the disk-type, the computer will instead transmit a control signal to the mechanical scanning system which causes the wafers to be moved along a pathway substantially perpendicular to the beam pathway at a velocity V which is proportional to I/q where: q is the expected charge per ion.

FIG. 6 shows the preferred control electronics 12 for the apparatus 10. A first current sensing circuit outlined in dashed lines at 63 is connected to the collector electrode 28 to measure or sample the collector current $I_s$ on the collector electrode 28. The preferred first current sensing circuit also transmits two collector current signals through the leads 80 and 81 to the computer 86. These collector current signals are collectively substantially a function of the beam particle current $I_p = I/q$ passing through the scanning wire beam monitor 16. The first current sensing circuit 63 preferably includes the preamplifier 65, the voltage to frequency converter 70, the signal gate and timer circuit 72, the counters 75, 79 and 82, and the interconnecting leads shown in FIG. 6. In a less preferred version, the first current sensing circuit could even be comprised of a current integrator which receives the collector current $I_s$ and transmits a collector current signal to a computer, where the collector current signal is an average or summation of the collector current $I_s$. A more detailed description of the preferred first current sensing circuit 63 follows.

The collector current $I_s$ is carried from the collector electrode 28 by the lead 64 to the preamplifier 65 which generates a voltage singal which is a function of the collector current $I_s$. The collector current $I_s$ generally has a cyclical configuration similar to that shown in FIG. 5. The amplitude of the voltage signal can be adjusted through a gain select which is located within the microcomputer 66. The gain select signal is transmitted from the microcomputer 66 to the preamplifier 65 through the lead 67 shown in FIG. 6. Preferably, the gain select will be adjustable so that the voltage signal can be adjusted from 0 to 10 volts. Although the gain select in the control electronics 12 for the apparatus 10 is located within the microcomputer 66, alternatively it could be located right on the preamplifier 65 or elsewhere. The voltage signal from the preamplifer 65 is carried by the lead 69 to the voltage to frequency converter 70 which converts the voltage signal into a pulse signal with a frequency which is a function of the collector current $I_s$. Preferably the pulse signal has a frequency within the range of 0 to 1 megahertz. The pulse signal is carried by the lead 71 to the signal gate and timer circuit 72.

As shown in FIG. 5, the collector current $I_s$ peaks at 55 and 60, and is at a low level at 68. The peaks 55 and 60 are caused by the secondary electron emission which occurs as the scanning wire 26 crosses the beam 15. With the scanning wire beam monitor 16 having a helical scanning wire 26, there are two periods of time when the collector current on the collector electrode 28 is due primarily to the scanning wire 26 crossing the beam pathway 19. Secondary electrons are emitted from the scanning wire 26 both when it crosses the beam pathway 19 in the X direction, and also in the Y direction. The peak 55 is caused by electron emission occurring from the wire 26 crossing the beam in the X direction. This peak 55 in the current $I_s$ will therefore be called the "X current" 55. Likewise, the peak 60 is caused by the wire 26 crossing the beam 15 in the Y direction, and is called the "Y current" 60. Both the X current 55 and Y current 60 are to be called "scan current" because they both occur as the scanning wire 26 passes through the beam 15. Since the peaks 55 and 60 are primarily representative of the secondary electron emission, portions of the scan current 55 and 60 could be sampled and measured to determine substantially the secondary electron emission.

However, as the ion beam 15 travels through any residual gas, that gas becomes ionized. Some of these gaseous ions are collected by the collector electrode 28 as indicated by the low level background current shown at 68 in FIG. 5. To more accurately determine the secondary electron current in the peaks 55 and 60, it is therefore preferred that portions of the background current 68 be sampled, and their effect subtracted from the X and Y, or "scan" current 55 and 60 portions. To accomplish the required sampling of the collector current $I_s$, the trigger mechanism signals are utilized by a signal gate and timer circuit 72 to gate portions of the pulse signal from the voltage to frequency convertor 70 to various counters 75 and 79. In effect, this sampling of pulse signal portions is a sampling of portions of the collector current $I_s$.

The trigger mechanism signals are carried by the lead 74 to the signal gate and timer curcuit 72 as shown in FIG. 6. The trigger mechanism 45 of the first scanning wire beam monitor 16, shown in FIGS. 1, and 3-4, transmits three different signals each time the rotor 25 rotates one cycle as shown graphically in FIG. 5. The initializing trigger signal, otherwise called the background signal 50, is the signal which is transmitted when the scanning wire 26 is located substantially away from the beam 15. As the wire 26 crosses the beam 15 in the X direction, the trigger mechanism 45 transmits the X trigger signal 51. The X trigger signal 51 causes the signal gate and timer circuit 72 to gate a portion of the pulse signal which is a function of the X current 55 to the peak counter 75 through the lead 76 as shown in FIG. 6. The gate closes automatically after a window of preferably about 10 milliseconds. Likewise, as the wire 26 crosses the beam 15 and the Y direction, the mechanism 45 transmits a Y trigger signal 52. The Y trigger signal 52 causes the signal gate and timer circuit 72 to gate a portion of the pulse signal which is a function of the Y current 60 to the peak counter 75 through the lead 76 as shown in FIG. 6. Again the gate closes automatically after a selected period of time, preferably 10 milliseconds. The peak counter 75 then counts the number $C_{SN}$ of these pulses in the pulse signal which are due to the scan current 55 and 60 portions. Thus, a representative "sample" of the scan current is sampled.

As shown in FIG. 5, the background trigger signal 50 is about 90° out of phase with respect to both the X and Y trigger signals 51 and 52. The background trigger signal 50 causes the signal gate and timer circuit 72 to gate a portion of the pulse signal which is a function of the background current 68 to the background counter 79 through the lead 77 as shown in FIG. 6. This gate also closes preferably after a 10 millisecond window. Thus, the background counter 79 counts a number $C_{BKG}$ of pulses in the pulse signal due to the sampled background current portions. Thus, a representative "sample" of the background current is sampled. Each background trigger signal 50 is gated by the signal gate and timer circuit 72 through the lead 78 to the cycle counter 82. Since one background trigger signal 50 is transmitted for each rotational cycle of the rotor 25, the cycle counter 82 counts the number $C_{CYC}$ of these cycles.

Signals which are a function of the numbers $C_{BKG}$, $C_{SN}$ and $C_{CYC}$ are carried from the counters 79, 75 and 82 through leads 80, 81 and 83 respectively to the microcomputer 66. The signals which are a function of the numbers $C_{BKG}$ and $C_{SN}$ are called "collector current" signals. These collector current signals which are fed into the computer 66 by the first current sensing circuit 63 are collectively a function of the beam particle current $I_p = I/q$. Additionally, these two collector current signals and the signal which is a function of $C_{CYC}$ are indicative of and are a function of a "proportional current" $I_a$ on the collector electrode 28 due to secondary electron emission. This "proportional current" $I_a$ is proportional to an average current on the collector electrode 28 due to secondary electron emission. The "proportional current" is approximately a cycle-averaged indication of secondary electron current flowing through the collector electrode 28.

The computer 66 calculates the proportional current $I_a$ on the collector electrode 28 due to the secondary electron emission as $I_a = (C_{SN} - MC_{BKG})/C_{CYC}$. "M" is the number of timesj per rotor cycle that the scanning wire 26 crosses the beam 15. With the helical scanning wire beam monitor 16, M is two. The first current sensing circuit 63 measures the scan current 55 and 60 two times, and the background current 68 one time for every rotor 25 cycle. Therefore, to subtract out the effect of the background current 68 from the scan current 55 and 60, the background current portions sampled and measured must be doubled in the above-stated computer equation for $I_a$.

The control electronics 12 shown in FIG. 6, includes a second current sensing circuit 85 which monitors the current $I_{FC}$ on the Faraday cup 18 due to the particle beam 15 when the Faraday cup 18 is positioned within the beam pathway 19 to measure the beam electrical current. The preferred second current sensing circuit is outlined by dashed lines as shown at 85 in FIG. 6. The second current sensing circuit 85 includes a Faraday cup logarithmic amplifier 54 which receives the Faraday cup current $I_{FC}$ through the lead 87. The Faraday cup logarithmic amplifier 54 transmits an analog signal which is proportional to log $I_{FC}$ to the analog to digital converter 89 through the lead 90. The analog to digital converter 89 converts the analog log $I_{FC}$ signal into a digital signal, called the "sensing device current signal", which is then transmitted through the lead 91 to the microcomputer 66. In place of the logarithmic amplifier 54 and the analog to digital converter 89, the second current sensing circuit 85 could have a linear amplifier with range switching. In a less preferred version, the second current sensing circuit 85 could even comprise an electrometer which receives the cup current $I_{FC}$ and transmits to a computer a sensing device current signal which is a function of the electrical current $I_{FC}$ in the ion beam 15.

The computer 66 comprises the Faraday cup current $I_{FC}$ with the proportional current $I_a$ which is indicative of the secondary electron emission. The computer 66 calculates a constant of proportionality $K = I_{FC}/I_a$. This constant of proportionality is utilized by the computer 66 to calculate the beam current $I = KI_a$ from the proportional (cycle-averaged secondary electron) current $I_a$ until K is recalculated when the Faraday cup again is positioned within the beam pathway 19. Meanwhile, the microcomputer 66 receives the second r signal through the lead 57 from the linear drive motor servo control 30. Using the computed beam current I, the distance r between the beam 15 and the disk axis 62, and other values which are fed into the computer, the computer calculates the appropriate instantaneous linear velocity V of the rotating disk 20 along the X' axis:

$$V = NI/2\pi rqD$$

The factors N, q and D can be placed in the computer 66 by the user. "N" is the desired number of single scans to be made by the beam 15 over the disk 20. A single scan occurs when the disk 20 moves along the X' axis in only one direction. A back and forth movement of the rotating disk 20 along the X' axis therefore is two scans. "q" is the charge per ion on the ions within the ion beam 15. "D" is the desired ion dose to be applied to the wafers 23. The factor "r", of course, is sent to the computer 66 by the linear drive system 21. The computer 66 then transmits a control signal through the lead 92 to the linear motor servo control 30. The linear drive motor servo control 30 then regulates the DC power going through the cable 59 to the linear translation mechanism 27 so that the rotating disk moves on a radial pathway 22 perpendicular to the beam 15 at the velocity $V = NI/2\pi rqD$.

In its use, the uniform ion implantation dose control apparatus 10 shown in FIG. 1-4 and 6 is used to ensure that the ion beam 15 paints the wafes 13 in a uniform fashion and at the desired dosage. As the wafers 23 are being unloaded from or loaded onto the disk 20, the Faraday cup mechanism 49 positions the Faraday cup 17 in the beam pathway 19 as shown in solid lines 17. The vacuum pump (not shown) meanwhile continuously evacuates the beamline 14 of gases. Since residual gases are not being produced when the wafers 23 are being unloaded from and loaded onto the disk 20, the vacuum conditions within the beam line 14 are good for utilizing the Faraday cup 17 to measure the beam electrical current $I_{FC}$. The Faraday cup current $I_{FC}$ is monitored by the second current sensing circuit 85, and a sensing device current signal is transmitted to the microcomputer 66. At the same time, the beam 15 impinges upon the helical scanning wire 26 as it crosses the beam pathway 19. Secondary electrons are emitted from the scanning wire 26 and collected by the collector electrode 28 to form the collector current $I_s$. Before utilizing the first current sensing circuit 63 to monitor and sample the collector current $I_s$, it may be desirable to divert the collector current $I_s$ to an oscilloscope or similar device to determine the beam 15 profile, and to then focus the beam, as disclosed in the patent to Herb. The collector current $I_s$ may then be switched back to the first current sensing circuit 63.

The first current sensing circuit 63 utilizes the trigger mechanism signals to operate the signal gate and timer circuit 72 to thereby allow portions of the pulse signal which are a function of the collector current $I_s$ to be gated to the counters 75 and 79 at the appropriate times. The counters 75 and 79 then transmit collector current signals ($C_{SN}$ and $C_{BRG}$) to the microcomputer 66 which are representative of the scan current 55 and 60 portions and background current 68 portions. The cycle counter 82 counts the number of cycles made by the rotor 25 and transmits a signal to the microcomputer 66 which is a function of the number $C_{CYC}$ of cycles. The two collector current signals ($D_{SN}$ and $C_{BKG}$) and the cycle counter signal collectively are a function of the proportional current $I_a$. The microcomputer 66 utilizes these two collector current signals and the cycle counter signal to calculate the proportional current $I_a$ on the collector electrode due to secondary electron emission. The computer calculates the proportional current:

$$I_a = (C_{SN} - 2\, C_{BKG})/C_{CYC}$$

Then when the disk 20 is entirely reloaded with the wafers 23, the Faraday cup moves out of the beam pathway 19 to the position shown at 18 in FIG. 1. As the beam 15 paints the wafers 23, the gas which is given off infiltrates the beam line 14. As the ion beam 15 travels through the gas, the gas becomes ionized because some of the ions within the beam are stripped of their electrons. Thus, the beam electrical current which is measured by a Faraday cup is no longer indicative of the beam particle current $I_p$. However, we have found that the number of secondary electrons emitted from the scanning wire 26 is linearly proportional to the beam particle current $I_p = I/q$ and, therefore, can be utilized to determine the beam particle current I/q. The proportional current $I_a$ is a function of and is indicative of the secondary electron emission. The Faraday cup current $I_{FC}$ when taken at low pressure vacuum is a function of the beam particle current I/q. Thus, a constant of proportionality K may be determined at low pressure vacuum wherein $K = I_{FC}/I_a$. The microcomputer 66 determines the constant of proportionality K in accordance with this equation from $I_{FC}$ and $I_a$.

Then as the beam 15 paints the wafers 23 after the Faraday cup moves out of the beam pathway 19 as shown at 18 in FIG. 1, the constant of proportionality K is used to determine the beam current I where I/q is equal to the beam particle current. The first current sensing circuit 63 continues to sample the collector current $I_s$ and to transmit the collector current signals to the microcomputer 66, along with the signal indicating the number $C_{CYC}$ of rotor cycles. Thus, as the ion beam 15 paints the wafers 23 and the computer 66 receives the r signal through the lead 57, the computer 66 computes $I=KI_a$ and $V=NI/2\pi rqD$. A control signal is then transmitted through the lead 92 to the linear drive motor servo control 30. The linear motor servo control 30 responds to the control signal by regulating power to the linear translation mechanism 27 which moves the rotating disk 20 along the X' axis shown in FIG. 2 at a velocity $V=NI/2\pi rqD$. The desired number "N" of single scans to be made by the beam 15 over the disk 20 can be entered by the user into the microcomputer 66 at the beginning of the procedure. The expected charge per ion q will be known for the particular ion beam 15 and also can be entered into the computer 66. In addition, the desired ion dose D which is to be applied to the wafers 23 also may be entered into the computer 66. The gain select for the preamplifier 65 should also be set at the desired level so that the first current sensing circuit 63 functions properly.

As the helical scanning wire 26 passes through the beam 15, it may cast a shadow on a wafer 25 preventing ions from reaching the wafer 23 for a short time $\Delta t$. The velocity with which the helical wire 26 passes through the beam is $$v' = 2\pi R/T \sqrt{2}$$

where T is the period of one rotational cycle (T=60/1140 sec.=0.0526 sec.), and R is the radius of rotation of the wire (R=2.38 cm). The amount of time that the wire is blocking part of the beam is $\Delta t = W/v'$ where W is the width of the wire (W=0.1 cm). Since the wire 26 crosses the beam 15 twice per cycle, the ions are blocked for a fraction of time, $2\Delta t/T$ representing 1.8% of the total period T. The small loss of ion particles is distributed over the entire disk 20 and will have little effect on the uniformity of dose. Even this small loss could be eliminated if the rotational speeds of the wire 26 and disk 20 were synchronized so that the shadows would fall between the wafers 23.

A worst case effect of shadowing occurs in the situation in which an ion implantation will be completed in two single direction scans through the beam. Even in this situation, the masimum linear scan velocity V of the disk 20 along the X' axis will be limited by the control computer to ensure that a given spot on the wafer 23 will pass through the beam at least four times each scan direction, i.e. the distance the disk travels linearly in each rotation is ¼ of the width of the beam. Therefore in the back and forth mortion of the disk 20, each spot will pass through the beam eight times. The maximum linear velocity V of the disk 20 will occur at an inner radius $r_i$ of the disk 20, where $r_i=8.9$ cm. The time required to pass through a 1 cm wide beam at the inner radius of the disk 20 is $t=T_D/2\pi r_i$, where $T_D$ is the period of rotation of the disk 20 (60 msec).

If the wire 26 is crossing the beam 15 in the Y direction such that the wire shadow is moving in a direction opposite to the direction of disk rotation, the duration of the shadow over a point is:

$$t_{sy}=W_s/(v'+V_D)$$

where $W_s$ is the width of the shadow (assumed equal to the width of the wire, 0.1 cm), and v' and $V_D$ are the velocity of the wire 26 and the rotational velocity of a point on the disk 20 respectively. The duration of the shadow over a point on the disk 20 is:

$$t_{sx}=W_s/v'$$

when the wire 26 is crossing the beam 15 in the X direction since a point on the disk is moving parallel to the length of the wire 26.

For the preferred helical scanning wire beam monitor 16, v'=201 sm/sec. The rotational velocity $V_D$ at the inner radius of the disk 20 is 932.2 cm/sec. Therefore, the corresponding shadow duration values of $t_{sy}$ and $t_{sx}$ are 0.088 msec. and 0.5 msec. respectively. If a small spot on a wafer is shadowed one of the eight times it passes through the beam, the resulting does error at that location is $$\Delta D = t_{sy}/8t \text{ or } t_{sx}/8t$$

where t is the time required for the point to pass through a 1 cm wide beam. Therefore, the dose error $\Delta D = 1.0\%$ or 5.8%.

This shadowing effect could be eliminated by using a straight scanning wire which crosses through the beam rotating in the same direction as the disk 20 and which is synchronized with the disk 20 so that the wire passes through the beam 15 while the beam 15 is between two wafers 23. However, the synchronization requires complex control circuitry. A dose error $\Delta D$ of less than 1% would be ensured by using a straight wire rotating asynchronously in the opposite direction to the disk. In fact if one required at least 10 scans of the disk (5 in each direction) for an implantation, the average dose errors shown above would drop by a factor of five.

Figure 7:
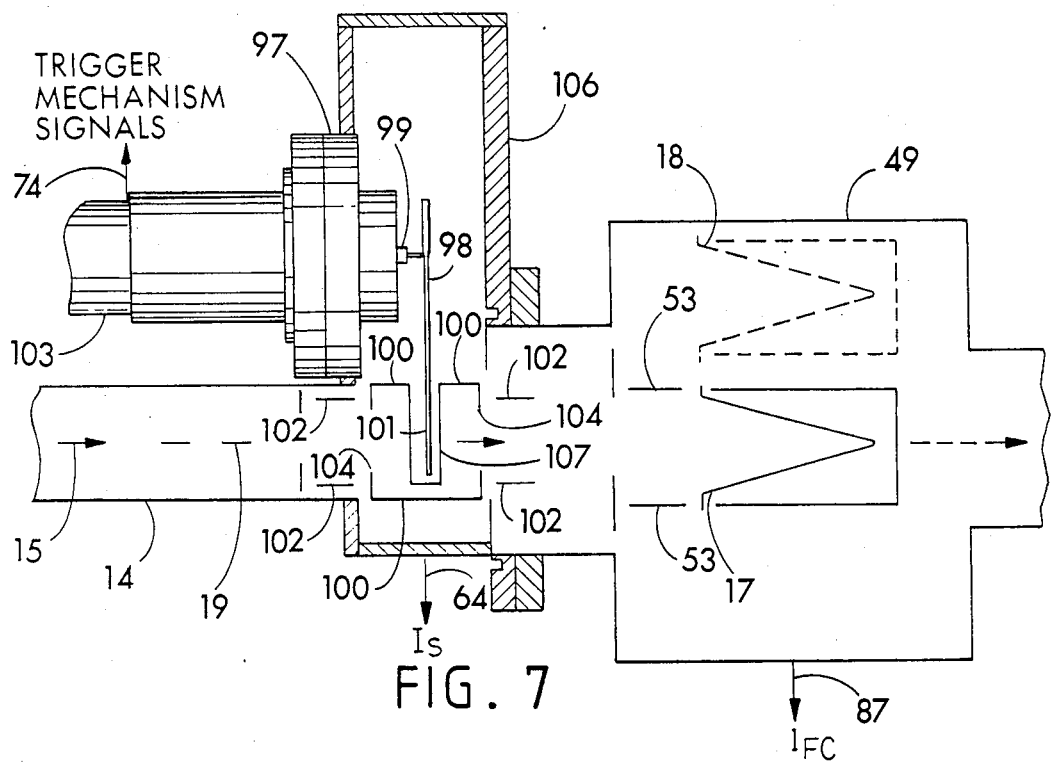
FIG. 7 is a diagrammatic, top plan view of the second preferred scanning wire beam monitor with straight scanning wire, and the attached Faraday cup mechanism.

Thus, an alternative scanning wire beam monitor 97 which is shown in both schematically and pictorially in FIG. 7 may be used in the beam line 14 instead of the helical scanning wire beam monitor 16. The beam monitor 97 shown in FIG. 7 functions somewhat similarly to the helical scanning wire beam monitor 16 except that the beam monitor 97 has a straight scanning wire 98. As shown in FIG. 7, the second scanning wire beam monitor 97 may be used with the same Faraday cup mechanism 49, and also with the other beamline equipment. The straight scanning wire beam monitor 97 includes a rotor 99 having a grounded straight scanning wire 98, a collector electrode 100 which is spaced outwardly from a portion 101 of the scanning wire 98 which emits the secondary electrons, and two suppressors 102 which are electrically negatively biased. The beam 15 passes through two openings 104 in the collector electrode 100. The rotor 99 is caused to rotate by the motor 103 so that the straight scanning wire 98 moves across the beam 15 to produce an emission of secondary electrons. The collector electrode 100 receives the secondary electrons which are emitted by the portion 100 of the straight scanning wire 98. The two suppressors 102 are each located adjacent to one of the collector electrode openings 104 to thereby inhibit an escape of secondary electrons through the openings 104 so that the collector electrode current readings are more indicative of secondary electron emission. The beam monitor 97 also includes the attached chamber 106 in which the straight scanning wire 98 rotates. As the wire 98 rotates, the portion 101 of the wire 98 passes through the collector slot 107 of the collector electrode 100 and the beam pathway 19. The straight scanning wire 98 crosses the beam 15 in only a single direction. Therefore, secondary electrons are emitted from the straight scanning wire 98 only once during each rotor 99 cycle. The collector electrode 100 current $I_s$ therefore appears substantially as shown in the bottom graph of FIG. 8 at 109. Each time the wire 98 passes through the beam 15, the collector electrode current $I_s$ increases, forming the "scan current" peak 100 shown in FIG. 8. The background current 111 also is shown in FIG. 8.

Figure 8:
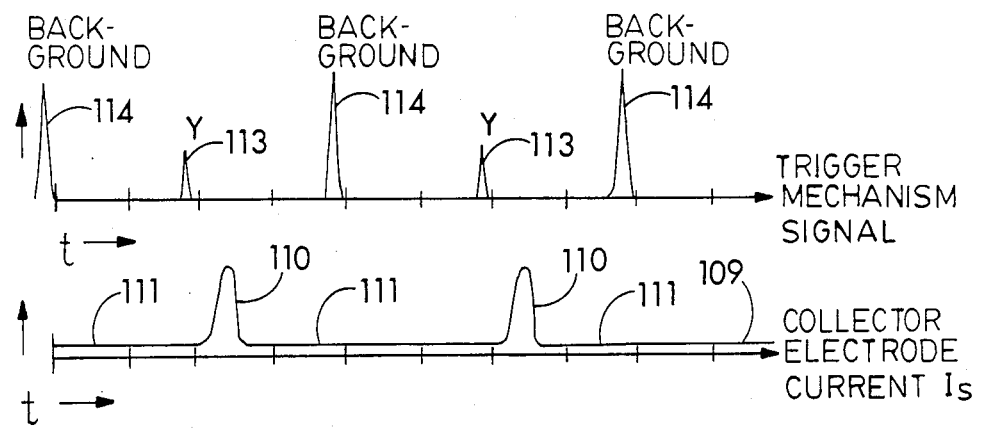
FIG. 8 shows cyclical graphs of the trigger mechanism signals and collector current $I_s$ of the second preferred scanning wire beam monitor.

Instead of three trigger signals being required to operate the signal gate and timer circuit 72, only two trigger signals 113 and 114 per cycle are required as shown in the upper graph of FIG. 8. Thus the trigger mechanism on the second preferred scanning wire beam monitor 97 has two permanent magnets (not shown) which are adapted to generate pulses in a pickup coil (not shown), instead of the three permanent magnets 46 which are used in the first preferred scanning wire beam monitor 16. Preferably the magnets on the second preferred scanning wire beam monitor 97 are located about 180° apart from one another so that as the rotor 99 rotates, trigger mechanism signals 113 and 114 are transmitted as shown in the upper graph of FIG. 8. The background trigger signal 114 can be utilized by the signal gate and timer circuit 72 to gate portions of the pulse signal which are a function of the background current 111 to the background counter 79 shown in FIG. 6. The Y trigger signal, or "scan trigger signal" 113 as shown in FIG. 8 can be utilized by the signal gate and timer circuit 72 to gate portions of the pulse signal which are a function of the Y current or "scan current" 110 to the peak counter 75 as shown in FIG. 6. The background trigger signal 114 also will be gated to the cycle counter 82 which counts the number $C_{CYC}$ of rotor 99 cycles made. As shown in FIG. 6, the microcomputer 66 will receive the $C_{SN}$, $C_{BKG}$, and $C_{CYC}$ signals through the leads 81, 80 and 83, and calculate the proportional current:

$$I_a = (C_{SN} - MC_{BKG})/C_{CYC}, \text{ where } M = 1.$$

As stated earlier, the second scanning wire beam monitor 97 operates similarly to the first scanning wire beam monitor 16 except that the scanning wire 99 crosses the beam 15 only one time per rotor cycle and the straight wire 98 causes less shadowing of the wafers 23 than the helical wire 26. Therefore, only two trigger mechanism signals 113 and 114 are required per rotor cycle. With the straight scanning wire 98, the microcomputer 66 will have to be adjusted to take into consideration that M=1 instead of 2. Additionally, with the straight scanning wire 99 crossing the beam 15 in only one direction, the user will not be able to divert the collector current $I_s$ to an oscilloscope to display the profile of the beam 15. Otherwise the function of the uniform dose control apparatus 10 with the second beam monitor 97 is quite similar to that of the apparatus 10 with the first beam monitor 16. Although the first and second scanning wire beam monitors 16 and 97 have a helical scanning wire 26 and a straight scanning wire 98, a scanning wire could be formed in most of any shape, as long as it is able to move across the beam 15.

It is to be understood that the present apparatus and method are not to be limited to the particular shape, arrangements and embodiments of parts or steps as disclosed and illustrated herein, nor to the materials specified, but embraces all such modified form thereof as comes within the scope of the following claims.

What is claimed is:

1. An apparatus for control of an implantation of a uniform dose of ion particles onto at least one wafer mounted on a mechanical scanning system which moves the wafers laterally across a pathway of the ion particle beam along a pathway perpendicular to the beam pathway so that the ion particles are implanted uniformly on the wafer, the apparatus comprising:
   (a) a scanning wire beam monitor including:
      (i) a rotor having a grounded scanning wire, the scanning wire being movable across the beam to produce an emission of secondary electrons, the scanning wire being moved by rotation of the rotor; and
      (ii) a collector electrode spaced outwardly from a portion of the scanning wire which is emitting secondary electrons to receive the secondary electrons, the collector electrode being configured to permit passage of the beam;
   (b) a first current sensing circuit which is connected to the collector electrode to measure a collector current $I_s$, which is independent of ion charge, on the collector electrode due to secondary electron emission, and which transmits at least one collector current signal which collector current signals are collectively substantially a function of a beam particle current I/q passing through the scanning wire beam monitor;
   (c) a beam electrical current sensing device which periodically senses the beam electrical current $I_{FC}$;
   (d) a second current sensing circuit which is connected to the beam electrical current sensing device to measure the beam electrical current $I_{FC}$ sensed by the sensing device due to the particle beam, and which transmits a sensing device current signal which is a function of the electrical current $I_{FC}$ in the ion beam;
   (e) a computer connected to receive both the collector current signals and the sensing device current signal, which computer calibrates said collector current signals to the sensing device current signal when said signals are both transmitted when the beam electrical current sensing device is sensing the beam electrical current $I_{FC}$, which computer when the ion beam particles are directed at the disk calculates a beam current I from said collector current signals, and which computer is connected to transmit a control signal to the mechanical scanning system to control said mechanical scannning system which moves the wafers along said perpendicular pathway at a velocity V which is proportional to I/q where: q is the expected charge per ion.

2. An apparatus for control of an implantation of a uniform dose of ion particles onto at least one wafer mounted on a rotating disk in the pathway of the ion particle beam, the apparatus comprising:
   (a) a scanning wire beam monitor including:
      (i) a rotor having a rounded scanning wire, the scanning wire being movable across the beam to produce an emission of secondary electrons, the scanning wire being moved by rotation of the rotor; and
      (ii) a collector electrode spaced outwardly from a portion of the scanning wire which is emitting secondary electrons to receive the secondary electrons, the collector electrode being configured to permit passage of the beam;

(b) a first current sensing circuit which is connected to the collector electrode to measure a collector current $I_s$, which is independent of ion charge, on the collector electrode due to secondary electron emission, and which transmits at least one collector current signal which collector current signals are collectively substantially a function of a beam particle current $I/q$ passing through the scanning wire beam monitor;

(c) a beam electrical current sensing device which periodically senses the beam electrical current $I_{FC}$;

(d) a second current sensing circuit which is connected to the beam electrical current sensing device to measure the beam electrical current $I_{FC}$ sensed by the sensing device due to the particle beam, and which transmits a sensing device current signal which is a function of the electrical current $I_{FC}$ in the ion beam;

(e) a disk translation system which moves the rotating disk along a radial pathway substantially perpendicular to the beam pathway; and (f) a computer connected to receive both the collector current signals and the sensing device current signal, which computer calibrates said collector current signals to the sensing device current signal when said signals are both transmitted when the beam electrical current sensing device is sensing the beam electrical current $I_{FC}$, which computer when the ion beam particles are directed at the disk calculates a beam current I from said collector current signals, and which computer is connected to transmit a control signal to the disk translation system to control said disk translation system which moves the rotating disk along said perpendicular radial pathway at a velocity $$V = NI/2\pi rqD$$

where:

N is the desired number of single scans to be made by the beam over the disk;
r is the distance between the beam and the axis of rotation of the disk;
q is the expected charge per ion; and
D is the desired ion dose to be applied to the wafers.

3. The apparatus specified in claim 2 wherein the scanning wire beam monitor further includes two suppressors which are electrically negatively biased and which each is located adjacent to one of the collector electrode openings to inhibit the escape of secondary electrons through the openings.

4. The apparatus specified in claim 2 wherein the beam electrical current sensing device is a Faraday cup which is periodically movable into the beam pathway to sense the beam electrical current $I_{FC}$.

5. The apparatus specified in claim 4 wherein said collector current signals are collectively a function of a proportional current $I_a$ which is proportional to an averaged current on the collector electrode due to secondary electron emission;
wherein the computer calibrates said collector current signals to the sensing device current signal by calculating a constant of proportionality $K = I_{FC}/I_a$; and wherein the computer calculates said beam current $I = KI_a$.

6. The apparatus specified in claim 5 wherein the scanning wire is helical in shape so that the scanning wire crosses the beam pathway twice for each rotational cycle of the rotor, once in a direction denoted as an X direction, and once in a direction perpendicular thereto denoted a Y direction, a portion of the collector current on the collector electrode which is done primarily to the scanning wire crossing the beam pathway in the X direction to cause secondary electron emission being called X current, and that portion of the collector current which is due primarily to the scanning wire crossing the beam pathway in the Y direction to cause secondary electron emission being called Y current.

7. The apparatus specified in claim 6 wherein the scanning wire beam monitor includes a trigger mechanism which transmits three trigger mechanism signals as the rotor rotates: an X trigger signal as the scanning wire crosses the beam in the X direction, a Y trigger signal as the scanning wire crosses the beam in the Y direction, and a background trigger signal approximately equally out of phase with both the X and Y trigger signals.

8. The apparatus specified in claim 7 wherein the first current sensing circuit includes:

(a) a preamplifier which generates a voltage signal which is a function of the collector current $I_s$;

(b) a voltage to frequency converter which is connected to receive and convert said voltage signal into a pulse signal with a frequency which is a function of the collector current $I_s$;

(c) a signal gate and timer circuit which is connected to receive the trigger mechanism signals and the pulse signal which is a function of the collector current $I_s$; the signal gate and timer circuit, when receiving the X trigger signal, opening a gate temporarily to allow a portion of the pulse signal to be transmitted which is a function of the X current; the signal gate and timer circuit, when receiving the Y trigger signal, opening the same gate temporarily which allows a portion of the pulse signal to be transmitted which is a function of the Y current; the signal gate and timer circuit, when receiving the background trigger signal, opening another gate temporarily which allows a portion of the pulse signal to be transmitted which is a function of a background current when the scanning wire is located substantially away from the beam pathway; and the signal gate and timer circuit transmitting a pulse each rotational cycle of the rotor;

(d) a peak counter which is connected to receive portions of the pulse signal which are a function of the X and Y currents, and which counter counts a number $C_{SN}$ of these pulses;

(e) a background counter which is connected to receive portions of the pulse signal which are a function of the background current, and which counter counts a number $C_{BKG}$ of these pulses; and (f) a cycle counter which is connected to receive the pulses which each indicate one rotor cycle, and which counts a number $C_{CYC}$ of these pulses.

9. The apparatus specified in claim 8 wherein the computer also calculates the proportional current $I_a$ on the collector electrode due to the scanning wire crossing the beam pathway as $I_a = (C_{SN} = 2C_{BKG})/C_{CYC}$.

10. The apparatus specified in claim 4 wherein the second current sensing circuit comprises:

(a) a logarithmic amplifier which transmits a signal proortional to log $I_{FC}$; and (b) an analog to digital converter which transmits a digital signal which is indirectly a function of $I_{FC}$ in that it is directly a function of log $I_{FC}$.

11. The apparatus specified in claim 4 wherein the scanning wire is straight in shape so that the scanning wire crosses the beam pathway once for each rotational cycle of the rotor, the collector current due primarily to the scanning wire crossing the beam pathway to cause secondary electron emission being called scan current.

12. The apparatus specified in claim 11 wherein the scanning wire beam monitor includes a trigger mechanism which transmits two trigger mechanism signals as the rotor rotates: a scan trigger signal as the scanning wire crosses the beam path, and a background trigger signal approximately 180° out of phase with the scan trigger signal.

13. The apparatus specified in claim 12 wherein the first current sensing circuit includes:
 (a) a preamplifier which generates a voltage signal which is a function of the collector current $I_s$;
 (b) a voltage to frequency converter which is connected to receive and convert said voltage signal into a pulse signal with frequency which is a function of the collector current $I_s$;
 (c) a signal gate and timer circuit which is connected to receive the trigger mechanism signals and the pulse signal which is a function of the collector current $I_s$; the signal gate and timer circuit, when receiving the scan trigger signal opening a gate temporarily to allow a portion of the pulse signal to be transmitted which is a function of the scan current; the signal gate and timer circuit, when receiving the background trigger signal, opening another gate temporarily which allows a portion of the pulse signal to be transmitted which is a function of a background current when the scanning wire is located substantially away from the beam pathway; and the signal gate and timer circuit transmitting a pulse each rotational cycle of the rotor;
 (d) a peak counter which is connected to receive portions of the pulse signal which are a function of the scan current, and which counts the number $C_{SN}$ of these pulses;
 (e) a background counter which is connected to receive portions of the pulse signal which are a function of the background current and which counts the number $C_{BKG}$ of these pulses; and
 (f) a cycle counter which is connected to receive the pulses which each indicate one rotor cycle, and which counts the number $C_{CYC}$ of these pulses.

14. The apparatus specified in claim 13 wherein the computer also calculates the proportional current $I_a$ on the collector electrode due to the scanning wire crossing the beam pathway as $I_a = (C_{SN} - C_{BKG})/C_{CYC}$.

15. A method of ion implantation dose control for implanting with an ion beam a uniform dose of ion particles onto at least one wafer mounted on a mechanical scanning system which moves the wafers so that the ion particles are implanted uniformly on the wafers, the method comprising the steps of:
 (a) moving a grounded object across a pathway of the ion beam to produce an emission of secondary electrons from the object;
 (b) collecting the secondary electrons to form a collector current $I_s$, which is independent of ion charge;
 (c) repeatedly sampling the collector current $I_s$ to obtain collector current samples, which samples are substantially a function of a beam particle current;
 (d) periodically measuring a beam electrical current $I_{FC}$;
 (e) periodically calibrating a collector current sample to the beam electrical current $I_{FC}$;
 (f) thereafter computer a beam current I from at least one collector current sample until the beam electrical current $I_{FC}$ is measured again;
 (g) moving the wafers along a pathway substantially perpendicular to the beam pathway at a velocity V which is proportional to I/q where: q is the exposed charge per ion.

16. A method of ion implantation dose control for implanting with an ion beam a uniform dose of ion particles onto at least one wafer mounted on a surface of a rotating disk, the method comprising the steps of:
 (a) moving a grounded object across a pathway of the ion beam to produce an emission of secondary electrons from the object;
 (b) collecting the secondary electrons to form a collector current $I_s$, which is independent of ion charge;
 (c) repeatedly sampling the collector current $I_s$ to obtain collector current samples, which samples are substantially a function of a beam particle current;
 (d) periodically measuring a beam electrical current $I_{FC}$;
 (e) periodically calibrating a collector current sample to the beam electrical current $I_{FC}$;
 (f) thereafter computing a beam current I from at least one collector current sample until the beam electrical $I_{FC}$ is measured again;
 (g) determining a distance r between the beam and the axis of rotation of the disk; and
 (h) moving the disk along a radial path substantially perpendicular to the beam pathway at a velocity $$V = NI/2\#rqD$$

where:
 N is the desired number of single scans to be made by the beam,
 q is the expected charge per ion, and
 D is the desired ion dose to be applied to the wafers.

17. A method of ion implantation dose control for implanting a uniform dose of ion particles onto at least one wafer mounted on a surface of a rotating disk, the method comprising the steps of:
 (a) moving a grounded scanning wire across an ion beam at regular intervals to produce emissions of secondary electrons from the scanning electrodes;
 (b) collecting the secondary electrons emitted to form a collector current $I_s$, which is independent of ion charge, with a collector electrode which is spaced outwardly from a portion of the scanning wire which is emitting secondary electrons;
 (c) periodically collecting the beam electrical current $I_{FC}$ with a Faraday cup;
 (d) measuring the beam electrical current with the Faraday cup;
 (e) repeatedly measuring at least one portion of the collector current, said portions collectively being substantially a function of a beam particle current;
 (f) periodically calibrating said portions of the collector current to the beam electrical current $I_{FC}$;

(g) thereafter computing a beam current I from said portions of collector current until the beam electrical current $I_{FC}$ is measured again;

(h) determining the distance r between the beam and the axis of rotation of the disk; and (i) moving the disk along a radial path substantially perpendicular to the beam pathway at a velocity $V = NI/2\#rqD$ where:

N is the desired number of single scans to be made by the beam over the disk, q is the charge per ion, and D is the desired ion dose to be applied to the wafers.

18. The method specified in claim 17 wherein said collector current portions are collectively a function of a proportional current $I_a$ which is substantially proportional to an average current on the collector electrode due to secondary electron emission;

wherein the step of periodically calibrating to the beam electrical current $I_{FC}$ is carried out by computing the proportional current $I_a$ from said collector current portions and computing a constant of proportionality $K = I_{FC}/I_a$; and wherein said step of computing the beam current I is carried out by calculating the beam current $I = KI_a$.

19. The method specified in claim 18 wherein the step of moving a scanning wire across an ion beam at regular intervals is carried out with a scanning wire beam monitor having a rotor with a helical scanning wire which crosses the beam pathway twice for each rotational cycle of the rotor.

20. The method specified in claim 18 wherein computing $I_a$ from said collector current portions includes subtracting out an effect of a background current caused by background ions from an ionization of residual gas.

21. The method specified in claim 20 wherein subtracting out the effect of background current is carried out by repeatedly sampling background current portions, and proportionally subtracting them from other measured portions of the collector current.

22. The method specified in claim 21 wherein the background current portions are sampled while the scanning wire is located substantially away from the beam.

23. The method specified in claim 21 wherein the step of determining the proportional current $I_a$ on the collector electrode includes converting the collector current $I_s$ into a pulse signal with a frequency which is a function of the collector current.

24. The method specified in claim 23 wherein the step of determining the proportional current $I_a$ on the collector electrode includes:

gating portions of the pulse signal which are a function of collector current on the collector electrode primarily due to secondary electron emission to a peak counter which counts the pulses $C_{SN}$;

gating portions of the pulse signal which are a function of collector current on the collector electrode due to background ionization of residual gas to a background counter which counts the pulses $C_{BKG}$;

counting the cycles $C_{CYC}$ of rotation of the rotor; and computing the average collector electrode current $I_a = (C_{SN} - M C_{BKG})/C_{CYC}$ where M is the number of times per rotor cycle that the scanning wire passes through the beam.

25. The method specified in claim 17 wherein the step of moving a scanning wire across an ion beam at regular intervals is carried out with a scanning wire beam monitor having a rotor with a straight scanning wire which crosses the beam pathway once for each rotational cycle of the rotor.

26. An apparatus for control of an implantation of a uniform dose of ion particles onto at least one wafer mounted on a mechanical scanning system which moves the wafers laterally across a pathway of the ion particle beam along a pathway perpendicular to the beam pathway so that the ion particles are implanted uniformly on the wafers, the apparatus comprising:

(a) a scanning wire beam monitor including:

(i) a rotor having a grounded scanning wire, the scanning wire being movable across the beam to produce an emission of secondary electrons, the scanning wire being moved by rotation of the rotor; and (ii) a collector electrode spaced outwardly from a portion of the scanning wire which is emitting secondary electrons to receive the secondary electrons, the collector electrode being configured to permit passage of the beam;

(b) a first current sensing circuit which is connected to the collector electrode to measure a collector current $I_s$ on the collector electrode due to secondary electron emission, and which transmits at least one collector current signal which collector current signals are collectively substantially a function of a beam particle current I/q passing through the scanning wire beam monitor, the first current sensing circuit further including means for subtracting out an effect of a background current caused by background ions from an ionization of residual gas;

(c) a beam electrical current sensing device which periodically senses the beam electrical current $I_{FC}$;

(d) a second current sensing circuit which is connected to the beam electrical current sensing device to measure the beam electrical current $I_{FC}$ sensed by the sensing device due to the particle beam, and which transmits a sensing device current signal which is a function of the electrical current $I_{FC}$ in the ion beam;

(e) a computer connected to receive both the collector current signals and the sensing device current signal, which computer calibrates said collector current signals to the sensing device current signal when said signals are both transmitted when the beam electrical current sensing device is sensing the beam electrical current $I_{FC}$, which computer when the ion beam particles are directed at the disk calculates a beam current I from said collector current signals, and which computer is connected to transmit a control signal to the mechanical scanning system to control said mechanical scanning system which moves the wafers along said perpendicular pathway at a velocity V which is proportional to I/q where: q is the expected charge per ion.

* * * * *